United States Patent
Mutnury et al.

(10) Patent No.: US 11,991,819 B2
(45) Date of Patent: May 21, 2024

(54) MICROSTRIP DELAY MATCHING USING PRINTED DIELECTRIC MATERIAL

(71) Applicant: Dell Products L.P., Round Rock, TX (US)

(72) Inventors: Bhyrav Mutnury, Austin, TX (US); Timothy M. Lambert, Austin, TX (US); Sandor Farkas, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 64 days.

(21) Appl. No.: 17/948,854

(22) Filed: Sep. 20, 2022

(65) Prior Publication Data
US 2024/0098883 A1    Mar. 21, 2024

(51) Int. Cl.
*H05K 1/02* (2006.01)

(52) U.S. Cl.
CPC ........... *H05K 1/024* (2013.01); *H05K 1/0245* (2013.01); *H05K 1/0248* (2013.01); *H05K 2201/0715* (2013.01)

(58) Field of Classification Search
CPC .... H05K 1/024; H05K 1/0245; H05K 1/0248; H05K 2201/0715
See application file for complete search history.

(56) References Cited

U.S. PATENT DOCUMENTS

| | | | |
|---|---|---|---|
| 9,024,196 B2 | 5/2015 | Yoneya et al. | |
| 10,375,823 B2 * | 8/2019 | Staudt | H01L 23/49894 |
| 10,710,359 B2 | 7/2020 | Zhang et al. | |
| 2010/0237961 A1 * | 9/2010 | Pai | H05K 1/024 |
| | | | 333/4 |
| 2021/0227683 A1 * | 7/2021 | Rowlands | H05K 1/0245 |

FOREIGN PATENT DOCUMENTS

EP        2953432 A1 * 12/2015 ................ H01P 1/02

* cited by examiner

*Primary Examiner* — Hoa C Nguyen
(74) *Attorney, Agent, or Firm* — Larson Newman, LLP

(57) ABSTRACT

A printed circuit board includes a first and second microstrip circuit traces formed on an outer surface of the printed circuit board, and a patterned dielectric material applied over a first length of the first microstrip circuit trace. The first microstrip circuit trace has a first length and carries a first signal. The second microstrip circuit trace is adjacent to the first microstrip circuit trace, has a second length longer than the first length, and carries a second signal. The patterned dielectric material is provided over a portion of the first length to delay the first signal relative to the second signal.

20 Claims, 6 Drawing Sheets

Top View

Top View

A – A

Side View

Top View

A – A
Side View

MICROSTRIP DELAY MATCHING USING PRINTED DIELECTRIC MATERIAL

CROSS REFERENCE TO RELATED APPLICATIONS

Related subject matter is contained in co-pending U.S. patent application Ser. No. 17/948,893 entitled "STRIP LINE DELAY MATCHING USING PRINTED DIELECTRIC MATERIAL," filed Sep. 20, 2022, the disclosure of which is hereby incorporated by reference.

FIELD OF THE DISCLOSURE

This disclosure generally relates to information handling systems, and more particularly relates to microstrip delay matching using printed dielectric material.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

A printed circuit board may include a first and second microstrip circuit traces formed on an outer surface of the printed circuit board, and a patterned dielectric material applied over a first length of the first microstrip circuit trace. The first microstrip circuit trace may have a first length and may carry a first signal. The second microstrip circuit trace may be adjacent to the first microstrip circuit trace, may have a second length longer than the first length, and may carry a second signal. The patterned dielectric material may be provided over a portion of the first length to delay the first signal relative to the second signal.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
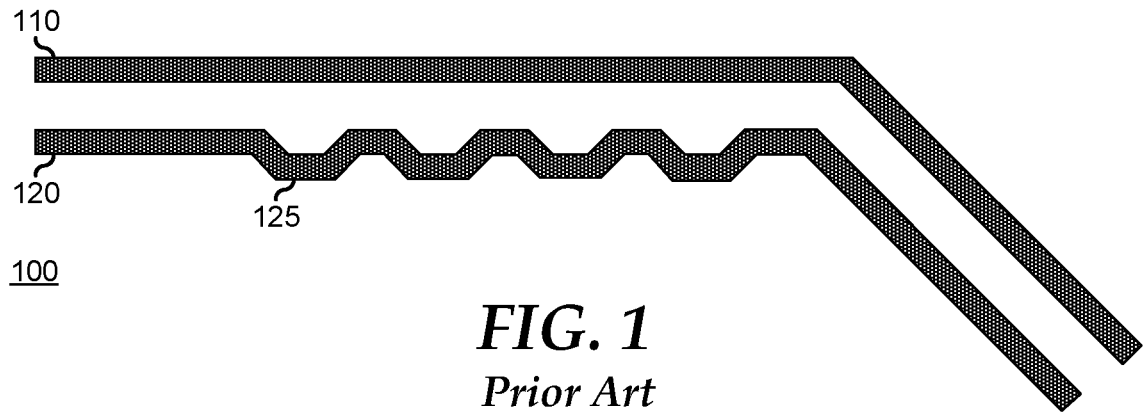
FIG. 1 is a diagram of a printed circuit board (PCB) with a delay-matched microstrip differential signal pair as may be known in the art.

FIG. 1 illustrates a top view of a printed circuit board (PCB) 100 as may be known in the art. PCB 100 provides circuit traces to implement a differential signal high-speed data communication interface, including circuit traces 110 and 120. Circuit traces 110 and 120 are implemented as microstrip traces on the surface of PCB 100. The details of PCB fabrication, including the creation of circuit traces thereon, the routing of microstrip traces, and the layout of differential signal circuit trace pairs, is known in the art and will not be further described herein, except as may be needed to illustrate the current embodiments.

High-speed data communication interfaces are sensitive to signal skew in the differential signal traces, and any delay mismatches between the signal traces may result in common mode conversion that leads to electro-magnetic interference (EMI) issues and reduced signal quality at the signal receiver. A major contributor to signal skew results from different lengths of the respective traces of the differential signal pair. In particular, signal traces in PCBs are not typically laid out in straight lines, but make circuitous paths through the PCB, resulting on one of the circuit traces of a differential pair traversing a longer circuit path than the other circuit trace of the differential pair. Thus, as illustrated circuit traces 110 and 120 are show as experiencing a bend in the circuit path. Circuit trace 110 traverses a longer path than circuit trace 120.

One method to de-skew the differential signal at the signal receiver, as may be known in the art, is to introduce additional length to the shorter circuit trace. Thus, as illustrated, circuit trace 120 includes a trace lengthening segment 125 to, in effect, slow down the signal on circuit trace 120 as compared to circuit trace 110. However, the introduction of features to lengthen the shorter circuit trace, such as the inclusion of trace lengthening segment 125, is known to increase the amount of space needed on PCB 100 to implement the differential signal pair, resulting in decreased trace routing density on the PCB. In addition, circuit trace lengthening may result in decreased coupling between the circuit traces of the differential signal pair, and a consequent decrease in the isolation between the differential signal pair and adjacent circuit traces implemented on the PCB, making the differential signal pair more susceptible to crosstalk and noise.

Figure 2A:
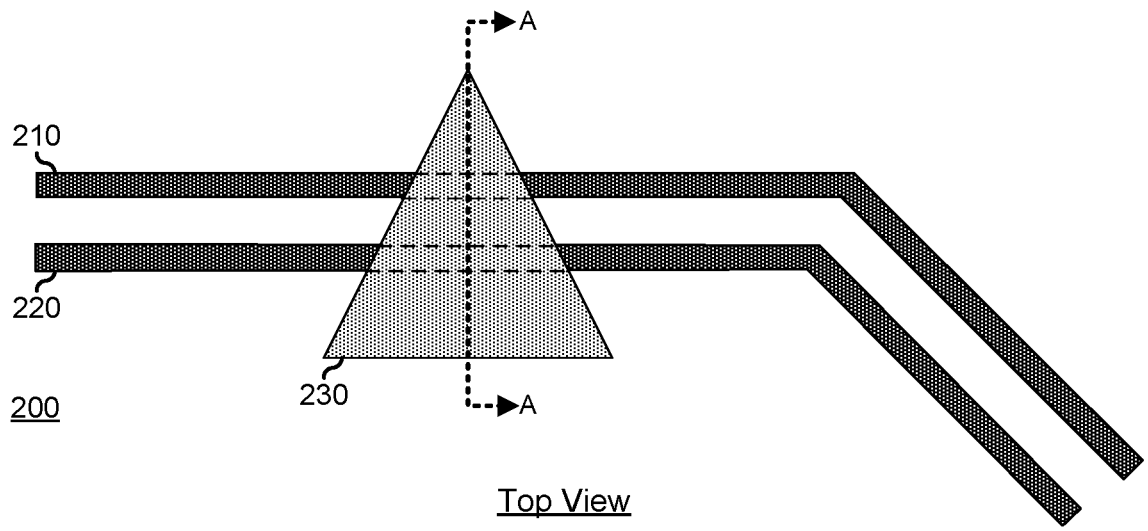
FIG. 2A is a top-view of a PCB with a delay-matched microstrip differential signal pair according to an embodiment of the current disclosure.
Figure 2B:
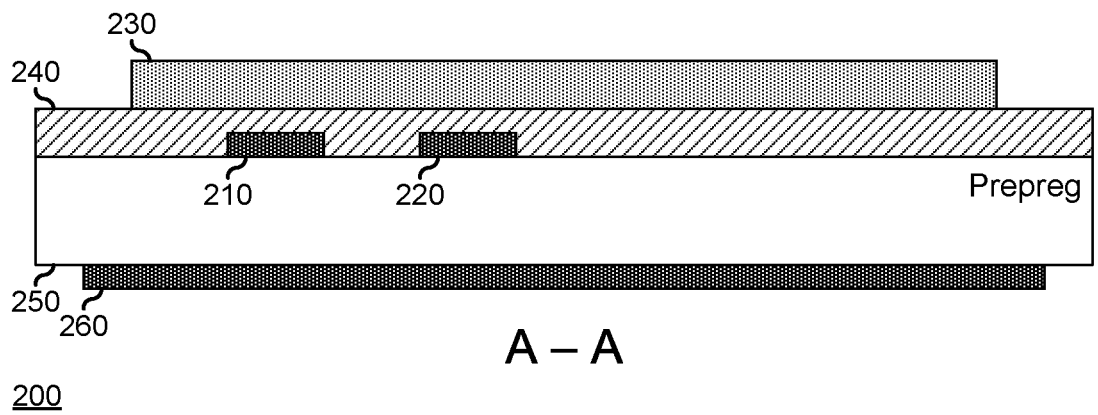
FIG. 2B is a side-view of the PCB of FIG. 2A.

FIGS. 2A and 2B illustrate a top-view and a side-view of a PCB 200 in accordance with the current embodiments. PCB 200 provides circuit traces to implement a differential signal high-speed data communication interface, including circuit traces 210 and 220. Circuit traces 210 and 220 are implemented as microstrip traces on the surface of PCB 200. PCB 200 will be understood to include multiple metal layers sandwiched between insulating layers. For simplicity of illustration, circuit traces 210 and 220 are shown as being fabricated on the surface of the PCB on an insulating layer 250, typically a prepreg layer, that is underlain by a metal layer 260 that is typically a ground layer. After the top surface of PCB 200 is patterned to include circuit traces 210 and 220, the top surface of the PCB coated with a solder mask layer 240, and a silk screen pattern 230 is printed on the solder mask layer.

The silk screen process by which silk screen pattern 230 is applied to the surface of solder mask layer 240 is typically provided to add informative annotations to the surface of PCB 200. For example, a manufacturer of PCB 200 may utilize the silk screen process to add a manufacturer logo, part number, serial number, or the like, or the silk screen process may be utilized to provide annotations to the various components on the PCB, as needed or desired. However, it has been understood by the inventors of the current embodiments that the dielectric constant ($D_K$) of the solder mask material ($D_{SM}$) is typically around 3.0. On the other hand, the silk screen material is typically an epoxy-based paint, and the dielectric constant of the silk screen material ($D_{SS}$) is typically in the range of 3.0-6.0. As such, the addition of silk screen material over a circuit trace operates to change the transmission line properties of the circuit trace. In particular, the addition of the silk screen material over a circuit trace increases the delay of signal on the circuit trace in proportion to the length of the circuit trace that is covered by the silk screen material. The selection of the silk screen material will affect the degree to which the performance of the covered circuit traces is affected. In particular, the higher the dielectric constant of the silk screen material ($D_{SS}$) is, the more the signals carried by the covered circuit traces is delayed. Specifically, selecting a silk screen material with a dielectric constant ($D_{SS}$) is 6.0 will yield a large delay per unit length of covered circuit trace, as compared with a silk screen material with a dielectric constant ($D_{SS}$) is 3.0.

Figure 3:
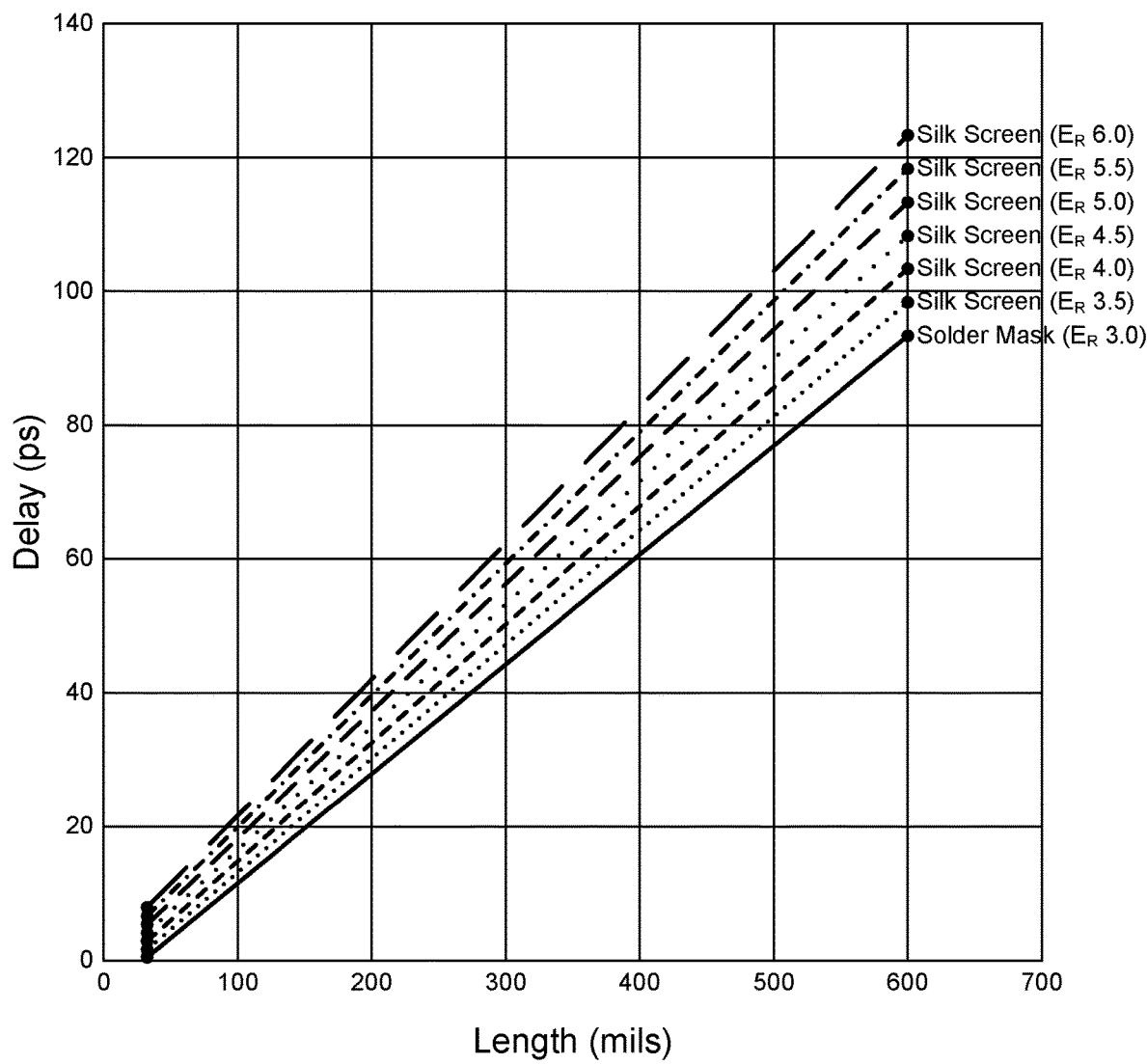
FIG. 3 is a graph illustrating signal delay versus coverage length for silk screen materials having various dielectric constants according to an embodiment of the current disclosure.

FIG. 3 illustrates a graph of the delay in pico-seconds (ps) versus the circuit trace coverage length (mils) for various dielectric constants of the silk screen material. As the dielectric constant of the silk screen material increases, the delay delta also increases. In a typical high-speed data communication interface, the trace length differences may introduce signal delays of around 4-10 ps. Thus it can be seen that a 4-10 ps delay can be compensated by applying around 100-150 mils of silk material to the shorter trace, where the difference between the dielectric constant of the solder mask ($D_{SM}$) and the dielectric constant of the silk screen material ($D_{SM}$) is around 2-3.

Returning to FIG. 2, silk screen pattern 230 is provided as a triangle for reasons described further below. In particular, silk screen pattern 230 has a base that is parallel to circuit traces 210 and 220, and that is formed on the side of the shorter one of the circuit traces (that is, circuit trace 220). From the base, silk screen pattern 230 extends to a point on the side of the longer one of the circuit traces (that is, circuit trace 210). As configured, silk screen pattern 230 introduces a delay into both circuit trace 210 and circuit trace 220. However, because the length of circuit trace 220 that is covered by silk screen pattern 230 is greater than the length of circuit trace 210 that is covered by the silk screen pattern, the delay introduced into circuit trace 220 is greater than the delay introduced into circuit trace 210. Thus, by adjusting the shape of silk screen pattern 230, the overall delay of the signal on circuit trace 220 can be adjusted to the degree needed to de-skew the differential signal carried by circuit traces 210 and 220.

For example, if a longer delay is needed on circuit trace 220, then the base of the triangle shape of silk screen pattern 230 can be lengthened. On the other hand, if a shorter delay is needed, then the base of the triangle shape of silk screen pattern 230 can be shortened. As illustrated, silk screen pattern 230 is an isosceles triangle, but this is not necessarily so, and other shapes may be utilized for the silk screen pattern, as needed or desired. For example, a silk screen pattern in the form of a right-triangle, a rhombus, or another shape that provides different coverage for each of the circuit traces. In another embodiment, only the shorter circuit trace is covered with the silk screen material, as needed or desired. However, certain advantages accrue to the use of triangular or rhomboid shapes as will be described further below. Note that the delay on a particular circuit trace may be adjusted utilizing multiple instances of a particular pattern or of different patterns as needed or desired. For example, multiple triangle patterns may be utilized as needed or desired, and the multiple triangle patterns may have different base lengths, as needed or desired.

It has been understood by the inventors of the current embodiments that the manufacturing tolerances for the application of silk screen material on a PCB are generally far looser than the manufacturing tolerances for the fabrication of the circuit traces included thereon. As such, it may be expected that the position silk screen pattern 230 may vary widely with respect to circuit traces 210 and 220. The use of a triangular silk screen pattern provides a uniform performance change to the relative delay of the signals carried on circuit traces 210 and 220, regardless of whether silk screen pattern 230 is perfectly aligned with a desired optimal position. In the following discussions regarding FIGS. 4A, 4B, 4C, 4D, and 4E, it will be assumed that the differential signal carried by the respective differential signal pairs traverse the differential signal pairs from the leftward side of the figure to the rightward side of the figure. However, this convention is made merely to simplify the following discussions.

Figure 4A:
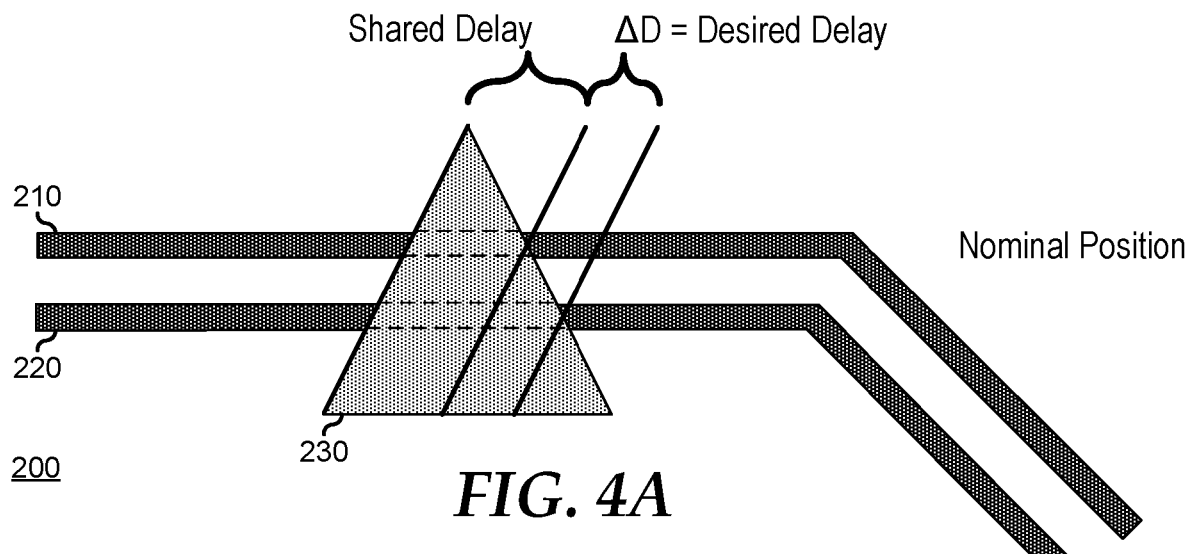
FIGS. 4A-E illustrate the PCB of FIG. 2 with various alignments of a silk screen pattern.

In FIG. 4A, PCB 200 is illustrated, including circuit traces 210 and 220, and silk screen pattern 230. At a leading edge (that is, the leftward edge) of silk screen pattern 230, both of circuit traces 210 and 220 begin to experience a uniform delay, illustrated by a first line on the leading edge of the silk screen pattern and the parallel line at the end of the portion of the silk screen pattern that covers circuit trace 210 at the rightward edge of the silk screen pattern. Thereafter, the signal on circuit trace 210 is no longer delayed, but the signal on circuit trace 220, being covered by additional silk screen material, experiences an additional delay (ΔD), illustrated by a third parallel line through the following edge of silk screen pattern 230 where the coverage of circuit trace 220 ends. This additional delay (ΔD) represents the amount of delay that is desired to be introduced into circuit trace 220 relative to circuit trace 210. More relative delay (ΔD) may be introduced into circuit trace 220 by widening the base of silk screen pattern 230, and less relative delay (ΔD) may be introduced by narrowing the base of the silk screen pattern.

Figure 4B:
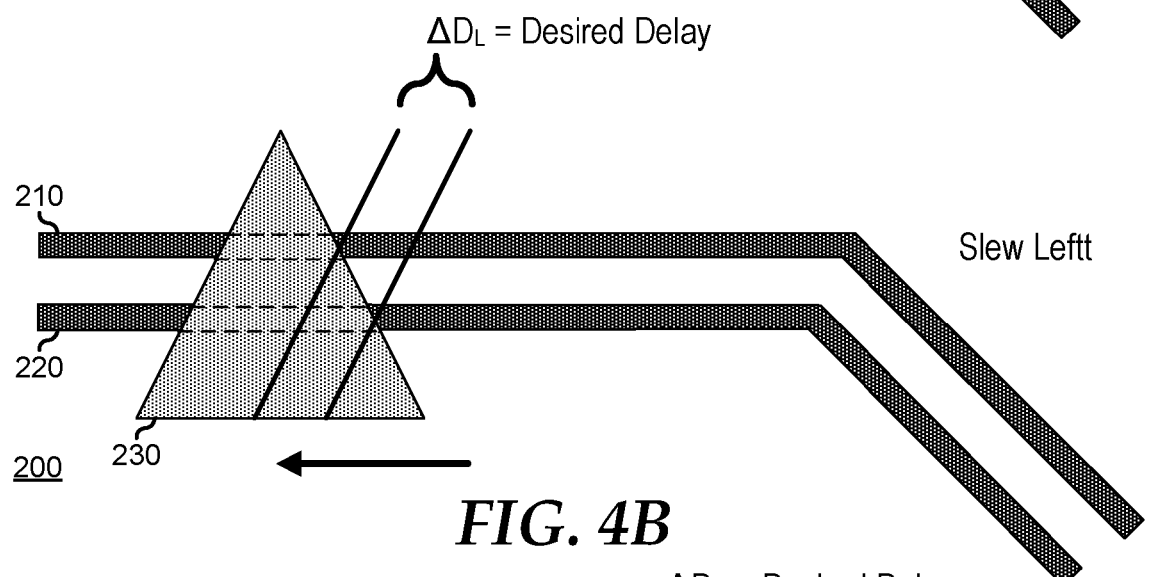
Figure 4C:
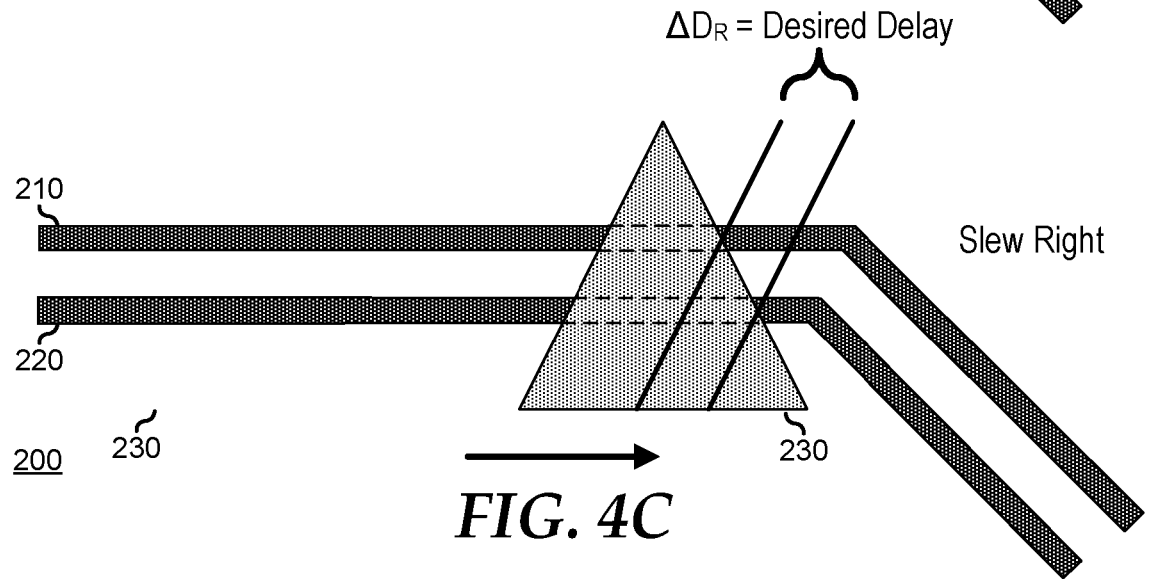

FIG. 4B illustrates a case where silk screen pattern 230 is misaligned leftward from the optimum position. Despite the leftward misalignment, the relative delay (ΔD) of circuit trace 220 with respect to circuit trace 210 remains unchanged. Similarly, FIG. 4C illustrates a case where silk screen pattern 230 is misaligned rightward from the optimum position. Despite the rightward misalignment, the relative delay (ΔD) of circuit trace 220 with respect to circuit trace 210 remains unchanged.

Figure 4D:
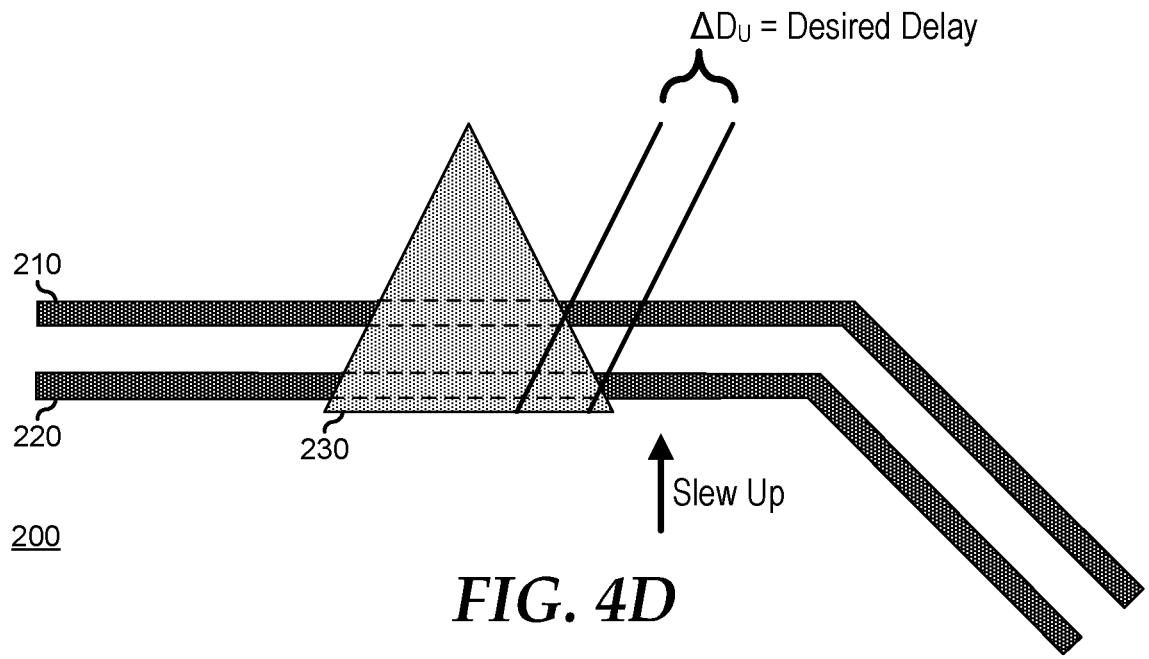
Figure 4E:
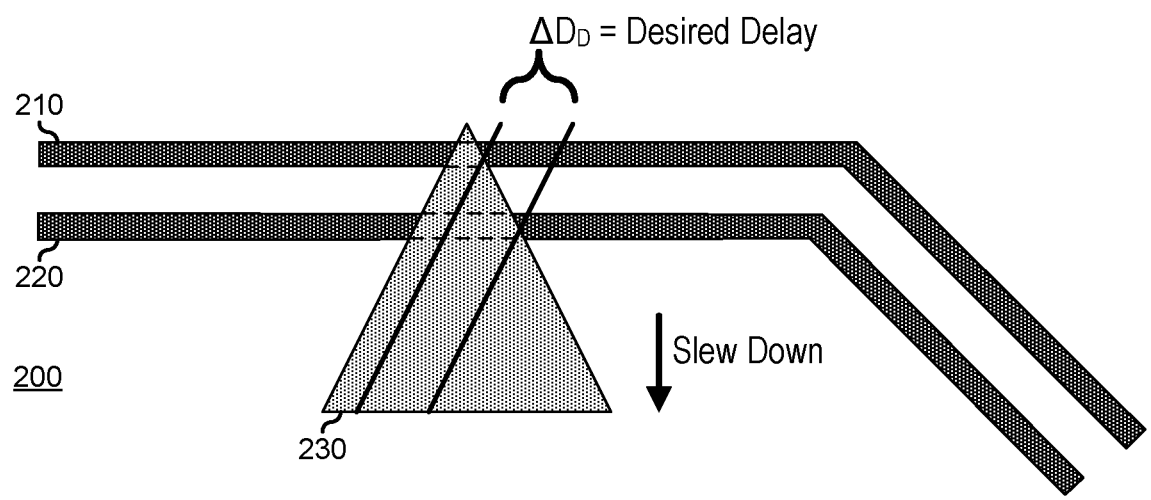

FIG. 4D illustrates PCB 200 in a case where silk screen pattern 230 is misaligned upward from the optimum position. Despite the upward misalignment, the relative delay (ΔD) of circuit trace 220 with respect to circuit trace 210 remains unchanged. Similarly, FIG. 4E illustrates a case where silk screen pattern 230 is misaligned downward from the optimum position. Despite the downward misalignment, the relative delay (ΔD) of circuit trace 220 with respect to circuit trace 210 remains unchanged.

As illustrated and described, silk screen pattern 230 is provided in the context of a silk screen process for marking the surface of PCB 200, but this is not necessarily so. For example, where silk screen pattern 230 is described as being formed by a silk screen material, such as an epoxy-based paint, the application of silk screen pattern 230 may more generally be provided in a separate process step similar to the silk screen process, but with another type of printed dielectric material. The use of a silk screen process with a silk screen material presupposes that the silk screen material is colored, and that the color is chosen to contrast with the color of PCB 200. However, where a printed dielectric material is used in a separate silk screen-like process, the printed dielectric material may be selected primarily for its dielectric properties, rather than for its color, and such a selection may provide a printed dielectric material that has a dielectric constant ($D_{DM}$) that is greater than 6.0, as needed or desired, and, for example, may be a transparent material, may be a same color as PCB 200, or another color from the color of a silk screen process provided for marking purposes.

The use of silk screen pattern 230, as described above, is provided in the context of a high-speed differential signal pair data communication interface, but this is not necessarily so. For example, other types of high-speed data communication interfaces, such as a data bus of a memory interface, a command/address bus of the memory interface, data strobe signals of the memory interface, or other types of interfaces that are sensitive to the relative delay of adjacent signals, may likewise benefit from the application of silk screen patter 230, as described above. In a particular embodiment, a silk screen pattern similar to silk screen pattern 230 is provided across multiple traces of a multi-trace bus, such as a single-ended signaling bus like a memory data bus. The silk screen pattern may be triangular shaped, to afford the benefits of silk screen pattern 230, as described. In a particular example, a memory bus may include 64 single-ended signal traces.

A single silk screen pattern across all 64 signal traces may be employed as needed or desired. However, extending a single silk screen pattern across all 64 signal traces may be unwieldy to implement, and may not be necessary, as the delay tolerances for a memory bus may be specified per memory device, and not on the entire bus. For example, the delay tolerances may be specified for the dynamic random access memory (DRAM) devices on a memory module that may each utilize eight (8) data lanes. It may be sufficient to provide a silk screen pattern for each group of eight (8) data lanes, for a total of eight (8) silk screen patterns for the data bus. Other configurations of circuit traces covered by a silk screen pattern to provide measured delay in the circuit traces may be utilized as needed or desired.

Figure 5A:
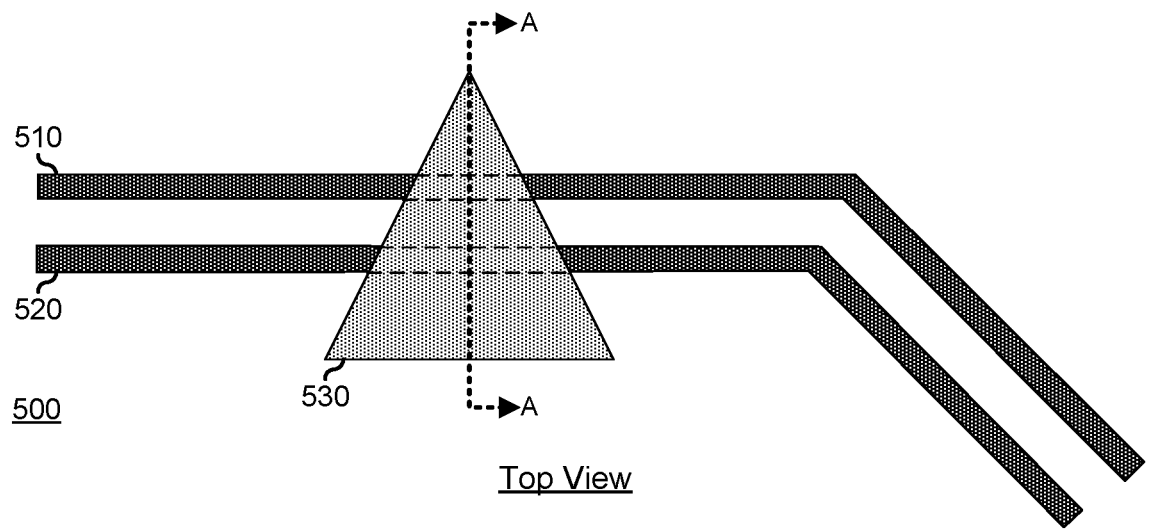
FIG. 5 is diagram including top- and side-views of the PCB with a delay-matched strip line differential signal pair according to an embodiment of the current disclosure.
Figure 5B:
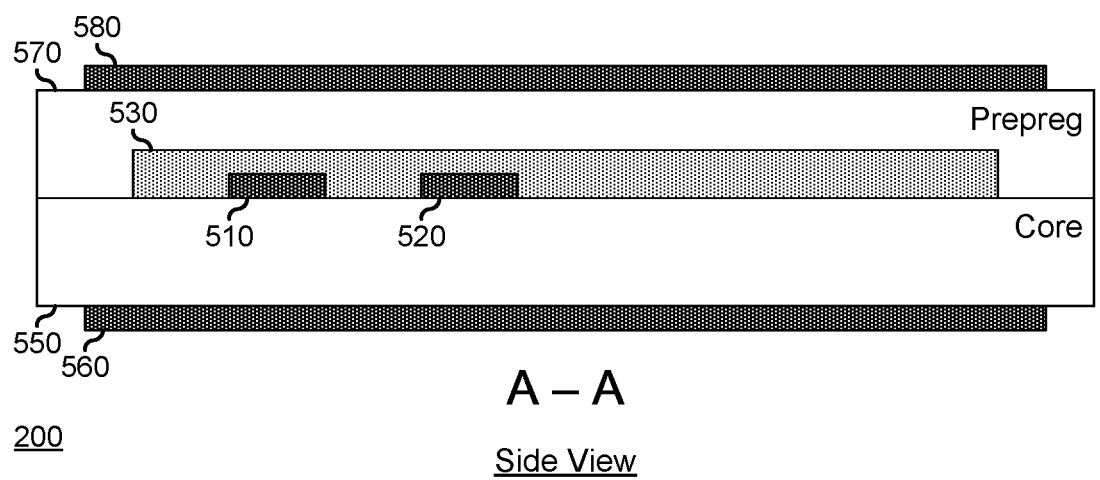

FIGS. 5A and 5B illustrate a top-view and a side-view of an inner layer of a PCB 500 in accordance with the current embodiments. PCB 500 provides circuit traces to implement a differential signal high-speed data communication interface, including circuit traces 510 and 520. Circuit traces 510 and 520 are implemented as strip line traces in an inner layer of PCB 500. PCB 500 includes multiple metal layers sandwiched between insulating layers. For simplicity of illustration circuit traces 510 and 520 are shown as being fabricated on the surface of an insulating layer 550, illustrated as a core layer, that is underlain by a metal layer 560 that is typically a ground layer. After the inner layer of PCB 500 is patterned to include circuit traces 510 and 520, a silk screen pattern 530 is printed on the inner layer of the PCB. After silk screen pattern 530 is printed, an insulating layer 570, illustrated as a prepreg layer, is applied that is overlain by another metal layer, typically a power or ground layer, as needed or desired.

An inner layer of PCB 500 will not typically be subjected to a silk screen process, in not being necessary to provide informative annotations on the inner layer. As such, it will be understood that the silk screen process by which silk screen pattern 530 is applied to the inner layer of PCB 400 represents an added processing step in the fabrication of PCB 500. The addition of silk screen material over a circuit trace operates to change the transmission line properties of the circuit trace. In particular, the addition of the silk screen material over a circuit trance increases the delay of signal on the circuit trace in proportion to the length of the circuit trace that is covered by the silk screen material. The selection of the silk screen material will affect the degree to which the performance of the covered circuit traces is affected. In particular the higher the dielectric constant of the silk screen material ($D_{SS}$) is, the more the signals carried by the covered circuit traces is delayed. Specifically, selecting a silk screen material with a dielectric constant ($D_{SS}$) is 6.0 will yield a large delay per unit length of covered circuit trace, as compared with a silk screen material with a dielectric constant ($D_{SS}$) is 3.0, as described.

Silk screen pattern 530 is provided as a triangle for the same reasons as described above. In particular, silk screen pattern 530 has a base that is parallel to circuit traces 510 and 520, and that is formed on the side of the shorter one of the circuit traces (that is, circuit trace 520). From the base, silk screen pattern 530 extends to a point on the side of the longer one of the circuit traces (that is, circuit trace 510). As configured, silk screen pattern 530 introduces a delay into both circuit trace 510 and circuit trace 520. However because the length of circuit trace 520 that is covered by silk screen pattern 530 is greater than the length of circuit trace 510 that is covered by the silk screen pattern, the delay introduced into circuit trace 520 is greater than the delay introduced into circuit trace 510. Thus, by adjusting the shape of silk screen pattern 530, the overall delay of the signal on circuit trace 520 can be adjusted to the degree needed to de-skew the differential signal carried by circuit traces 510 and 520.

For example, if a longer delay is needed on circuit trace 520, then the base of the triangle shape of silk screen pattern 530 can be lengthened. On the other hand, if a shorter delay is needed, then the base of the triangle shape of silk screen pattern 530 can be shortened. As illustrated silk screen pattern 530 is an isosceles triangle, but this is not necessarily so, and other shapes may be utilized for the silk screen pattern, as needed or desired. For example, a silk screen pattern in the form of a right-triangle, a rhombus, or another shape that provides different coverage for each of the circuit traces. In another embodiment, only the shorter circuit trace is covered with the silk screen material, as needed or desired. However, certain advantages accrue to the use of triangular or rhomboid shapes as described above. Note that the delay on a particular circuit trace may be adjusted utilizing multiple instances of a particular pattern or of different patterns as needed or desired. For example, multiple triangle patterns may be utilized as needed or desired, and the multiple triangle patterns may have different base lengths, as needed or desired.

Silk screen pattern 530 may be provided in a separate process silk screen process with any suitable type of printed dielectric material, and the printed dielectric material may be selected primarily for its dielectric properties, rather than for its color, and such a selection may provide a printed dielectric material that has a dielectric constant ($D_{DM}$) that is greater than 6.0, as needed or desired, and, for example, may be a transparent material, may be a same color as PCB 500, or another color from the color of a silk screen process provided for marking purposes.

The use of silk screen pattern 530, as described, is provided in the context of a high-speed differential signal pair data communication interface, but this is not necessarily so. For example, other types of high-speed data communication interfaces, such as a data bus of a memory interface, a command/address bus of the memory interface, data strobe signals of the memory interface, or other types of interfaces that are sensitive to the relative delay of adjacent signals, may likewise benefit from the application of silk screen patter 530, as described above. In a particular embodiment, a silk screen pattern similar to silk screen pattern 530 is provided across multiple traces of a multi-trace bus, such as a single-ended signaling bus like a memory data bus. The silk screen pattern may be triangular shaped, to afford the benefits of silk screen pattern 530, as described above. In a particular example, a memory bus may include 64 single-ended signal traces. A single silk screen pattern across all 64 signal traces may be employed as needed or desired. However, extending a single silk screen pattern across all 64 signal traces may be unwieldy to implement, and may not be necessary, as the delay tolerances for a memory bus may be specified per memory device, and not on the entire bus. For example, the delay tolerances may be specified for the DRAM devices on a memory module that may each utilize eight (8) data lanes. It may be sufficient to provide a silk screen pattern for each group of eight (8) data lanes, for a total of eight (8) silk screen patterns for the data bus. Other configurations of circuit traces covered by a silk screen pattern to provide measured delay in the circuit traces may be utilized as needed or desired.

Figure 6:
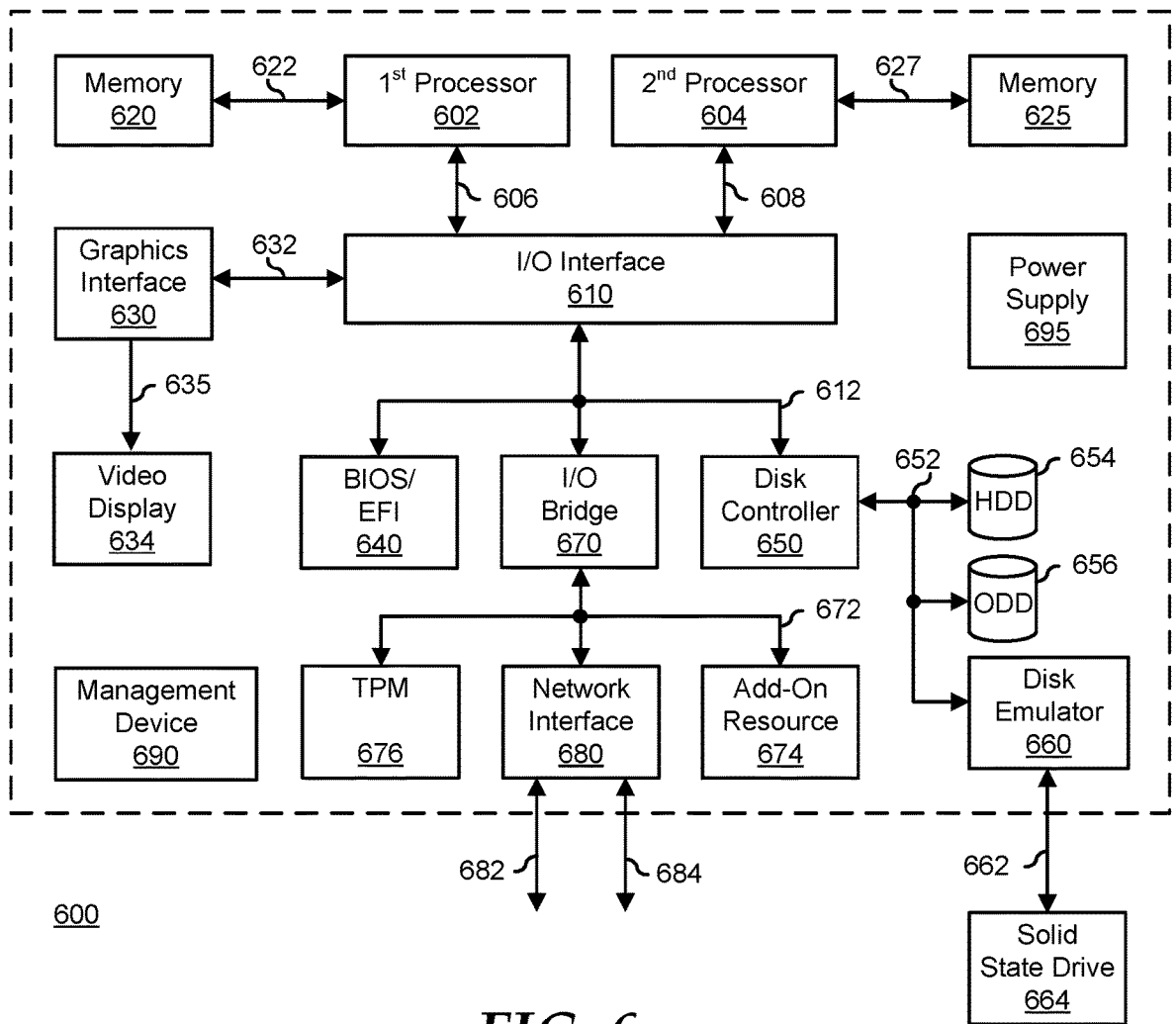
FIG. 6 is a block diagram illustrating a generalized information handling system according to another embodiment of the present disclosure.

FIG. 6 illustrates a generalized embodiment of an information handling system 600. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 600 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 600 can include processing resources for executing machine-executable code, such as a central processing unit (CPU), a programmable logic array (PLA), an embedded device such as a System-on-a-Chip (SoC), or other control logic hardware. Information handling system 600 can also include one or more computer-readable medium for storing machine-executable code, such as software or data. Additional components of information handling system 600 can include one or more storage devices that can store machine-executable code, one or more communications ports for communicating with external devices, and various input and output (I/O) devices, such as a keyboard, a mouse, and a video display. Information handling system 600 can also include one or more buses operable to transmit information between the various hardware components.

Information handling system 600 can include devices or modules that embody one or more of the devices or modules described below, and operates to perform one or more of the methods described below. Information handling system 600 includes processors 602 and 604, an input/output (I/O) interface 610, memories 620 and 625, a graphics interface 630, a basic input and output system/universal extensible firmware interface (BIOS/UEFI) module 640, a disk controller 650, a hard disk drive (HDD) 654, an optical disk drive (ODD) 656, a disk emulator 660 connected to an external solid state drive (SSD) 662, an I/O bridge 670, one or more add-on resources 674, a trusted platform module (TPM) 676, a network interface 680, a management device 690, and a power supply 695. Processors 602 and 604, I/O interface 610, memory 620 and 625, graphics interface 630, BIOS/UEFI module 640, disk controller 650, HDD 654, ODD 656, disk emulator 660, SSD 662, I/O bridge 670, add-on resources 674, TPM 676, and network interface 680 operate together to provide a host environment of information handling system 600 that operates to provide the data processing functionality of the information handling system. The host environment operates to execute machine-executable code, including platform BIOS/UEFI code, device firmware, operating system code, applications, programs, and the like, to perform the data processing tasks associated with information handling system 600.

In the host environment, processor 602 is connected to I/O interface 610 via processor interface 606, and processor 604 is connected to the I/O interface via processor interface 608. Memory 620 is connected to processor 602 via a memory interface 622. Memory 625 is connected to processor 604 via a memory interface 627. Graphics interface 630 is connected to I/O interface 610 via a graphics interface 632, and provides a video display output 635 to a video display 634. In a particular embodiment, information handling system 600 includes separate memories that are dedicated to each of processors 602 and 604 via separate memory interfaces. An example of memories 620 and 625 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 640, disk controller 650, and I/O bridge 670 are connected to I/O interface 610 via an I/O channel 612. An example of I/O channel 612 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 610 can also include one or more other I/O interfaces, including an Industry Standard Architecture (ISA) interface, a Small Computer Serial Interface (SCSI) interface, an Inter-Integrated Circuit (I²C) interface, a System Packet Interface (SPI), a Universal Serial Bus (USB), another interface, or a combination thereof. BIOS/UEFI module 640 includes BIOS/UEFI code operable to detect resources within information handling system 600, to provide drivers for the resources, initialize the resources, and access the resources. BIOS/UEFI module 640 includes code that operates to detect resources within information handling system 600, to provide drivers for the resources, to initialize the resources, and to access the resources.

Disk controller 650 includes a disk interface 652 that connects the disk controller to HDD 654, to ODD 656, and to disk emulator 660. An example of disk interface 652 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 660 permits SSD 664 to be connected to information handling system 600 via an external interface 662. An example of external interface 662 includes a USB interface, an IEEE 1394 (Firewire) interface, a proprietary interface, or a combination thereof. Alternatively, solid-state drive 664 can be disposed within information handling system 600.

I/O bridge 670 includes a peripheral interface 672 that connects the I/O bridge to add-on resource 674, to TPM 676, and to network interface 680. Peripheral interface 672 can be the same type of interface as I/O channel 612, or can be a different type of interface. As such, I/O bridge 670 extends the capacity of I/O channel 612 when peripheral interface 672 and the I/O channel are of the same type, and the I/O bridge translates information from a format suitable to the I/O channel to a format suitable to the peripheral channel 672 when they are of a different type. Add-on resource 674 can include a data storage system, an additional graphics interface, a network interface card (NIC), a sound/video processing card, another add-on resource, or a combination thereof. Add-on resource 674 can be on a main circuit board, on a separate circuit board or add-in card disposed within information handling system 600, a device that is external to the information handling system, or a combination thereof.

Network interface 680 represents a NIC disposed within information handling system 600, on a main circuit board of the information handling system, integrated onto another component such as I/O interface 610, in another suitable location, or a combination thereof. Network interface device 680 includes network channels 682 and 684 that provide interfaces to devices that are external to information handling system 600. In a particular embodiment, network channels 682 and 684 are of a different type than peripheral channel 672 and network interface 680 translates information from a format suitable to the peripheral channel to a format suitable to external devices. An example of network channels 682 and 684 includes InfiniBand channels, Fibre Channel channels, Gigabit Ethernet channels, proprietary channel architectures, or a combination thereof. Network channels 682 and 684 can be connected to external network resources (not illustrated). The network resource can include another information handling system, a data storage system, another network, a grid management system, another suitable resource, or a combination thereof.

Management device 690 represents one or more processing devices, such as a dedicated baseboard management controller (BMC) System-on-a-Chip (SoC) device, one or more associated memory devices, one or more network interface devices, a complex programmable logic device (CPLD), and the like, that operate together to provide the management environment for information handling system 600. In particular, management device 690 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 600, such as system cooling fans and power supplies. Management device 690 can include a network connection to an external management system, and the management device can communicate with the management system to report status information for information handling system 600, to receive BIOS/UEFI or system firmware updates, or to perform other task for managing and controlling the operation of information handling system 600. Management device 690 can operate off of a separate power plane from the components of the host environment so that the management device receives power to manage information handling system 600 when the information handling system is otherwise shut down. An example of management device 690 includes a commercially available BMC product or other device that operates in accordance with an Intelligent Platform Management Initiative (IPMI) specification, a Web Services Management (WS-Man) interface, a Redfish Application Programming Interface (API), another Distributed Management Task Force (DMTF), or other management standard, and can include an Integrated Dell Remote Access Controller (iDRAC), an Embedded Controller (EC), or the like. Management device 690 may further include associated memory devices, logic devices, security devices, or the like, as needed or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A printed circuit board, comprising:
   a first microstrip circuit trace on an outer surface of the printed circuit board, the first microstrip circuit trace having a first straight section with a first length and configured to carry a first signal;
   a second microstrip circuit trace adjacent to the first microstrip circuit trace on the outer surface, the second microstrip circuit having a second straight section with a second length longer than the first length and configured to carry a second signal; and
   a patterned dielectric material applied over a first portion of the first straight section to delay the first signal relative to the second signal.

2. The printed circuit board of claim 1, wherein the patterned dielectric material is further applied over a second portion of the second straight section.

3. The printed circuit board of claim 2, wherein the first portion is longer than the second portion.

4. The printed circuit board of claim 3, wherein the patterned dielectric material is formed in a triangular shape.

5. The printed circuit board of claim 4, wherein the patterned dielectric material has a base of the triangular shape formed parallel to the first and second microstrip circuit traces, and formed on a side of the first microstrip circuit trace that is opposite to the second microstrip circuit trace.

6. The printed circuit board of claim 5, wherein the patterned dielectric material has a point of the triangular shape opposite the base, the point formed on a side of the second microstrip circuit trace opposite to the first microstrip circuit trace.

7. The printed circuit board of claim 1, wherein the patterned dielectric material is applied in a silk screen process.

8. The printed circuit board of claim 1, wherein the first microstrip circuit trace and the second microstrip circuit trace form a differential signal pair.

9. The printed circuit board of claim 1, wherein the first microstrip circuit trace and the second microstrip circuit trace form separate single-ended signal traces of a common data communication bus.

10. The printed circuit board of claim 1, wherein the patterned dielectric material has a dielectric constant of between 3.0 and 6.0.

11. A printed circuit board, comprising:
    a first microstrip circuit trace on an outer surface of the printed circuit board, the first microstrip circuit trace having a first straight section with a first length and configured to carry a first signal;
    a second microstrip circuit trace adjacent to the first microstrip circuit trace on the outer surface, the second microstrip circuit having a second straight section with a second length longer than the first length and configured to carry a second signal;
    a solder mask material applied over the outer surface of the printed circuit board; and
    a patterned dielectric material applied over the solder mask material, the patterned dielectric material configured to cover a portion of the first straight section to delay the first signal relative to the second signal.

12. A method comprising:
    forming, on an outer surface of a printed circuit board, a first microstrip circuit trace, the first microstrip circuit trace having a first straight section with a first length and configured to carry a first signal;
    forming, on the outer surface of the printed circuit board, a second microstrip circuit trace adjacent to the first microstrip circuit trace, the second microstrip circuit having a second straight section with a second length longer than the first length and configured to carry a second signal; and
    applying, over a first portion of the first straight section, a patterned dielectric material to delay the first signal relative to the second signal.

13. The method of claim 12, further comprising applying, over a second portion of the second straight section, the patterned dielectric material.

14. The method of claim 13, wherein the first portion is longer than the second portion.

15. The method of claim 14, wherein the patterned dielectric material is formed in a triangular shape.

16. The method of claim 15, wherein the patterned dielectric material has a base of the triangular shape formed parallel to the first and second microstrip circuit traces, and formed on a side of the first microstrip circuit trace that is opposite to the second microstrip circuit trace.

17. The method of claim 16, wherein the patterned dielectric material has a point of the triangular shape opposite the base, the point formed on a side of the second microstrip circuit trace opposite to the first microstrip circuit trace.

18. The method of claim 12, further comprising applying the patterned dielectric material in a silk screen process.

19. The method of claim 12, wherein the first microstrip circuit trace and the second microstrip circuit trace form a differential signal pair.

20. The method of claim 12, wherein the first microstrip circuit trace and the second microstrip circuit trace form separate single-ended signal traces of a common data communication bus.

* * * * *